United States Patent
Ben-Yishay et al.

(10) Patent No.: US 8,629,708 B2
(45) Date of Patent: Jan. 14, 2014

(54) HIGH CONVERSION GAIN HIGH SUPPRESSION BALANCED CASCODE FREQUENCY QUADRUPLER

(75) Inventors: Roee Ben-Yishay, Haifa (IL); Roi Carmon, Nesher (IL); Danny Elad, Moshav Liman (IL); Oded Katz, Ganei-Tikva (IL); Benny Sheinman, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/355,537

(22) Filed: Jan. 22, 2012

(65) Prior Publication Data

US 2013/0187714 A1 Jul. 25, 2013

(51) Int. Cl.
*G06G 7/16* (2006.01)

(52) U.S. Cl.
USPC .................. 327/359; 455/323; 327/357

(58) Field of Classification Search
USPC .................. 327/335–361; 455/323, 326
See application file for complete search history.

(56) References Cited

U.S. PATENT DOCUMENTS

| | | | | |
|---|---|---|---|---|
| 5,815,014 | A * | 9/1998 | Zhang et al. | 327/122 |
| 8,237,472 | B2 * | 8/2012 | Kuo et al. | 327/119 |
| 2006/0145737 | A1 * | 7/2006 | Yamamoto et al. | 327/119 |
| 2010/0158084 | A1 | 6/2010 | Voinigescu et al. | |

OTHER PUBLICATIONS

Hung et al, "High-Power High-Efficiency SiGe Ku- and Ka-Band Balanced Frequency Doublers" IEEE Trans. Microwave Theory & Tech., vol. 53, No. 2, pp. 754-761, Feb. 2005.

Kuo, et al., "A 52-75 GHz frequency quadrupler in 0.25-μm SiGe BiCMOS process", Microwave Integrated Circuits Conference (EuMIC), 2010 European, pp. 365-368, Sep. 2010.

Campos-Roca, et al., "Coplanar pHEMT MMIC frequency multipliers for 76-GHz automotive radar", Microwave and Guided Wave Letters, IEEE, vol. 9 Issue: 6, pp. 242-244, Jun. 1999.

Shirakawa et al., "A 15/60 GHz one-stage MMIC frequency quadrupler", Microwave and Millimeter-Wave Monolithic Circuits Symposium, 1996. Digest of Papers., IEEE 1996, pp. 35-38, Jun. 1996.

* cited by examiner

*Primary Examiner* — Dinh T. Le

(57) ABSTRACT

A frequency quadrupler comprises a balanced topology which increases broadband odd harmonic suppression. The frequency quadrupler is constructed in a cascode configuration which is a two-stage amplifier composed of a transconductance amplifier followed by a current buffer. The cascode is constructed with common emitter (CE) and common base (CB) stages which further improves the multiplier frequency response. The cascode configuration enables a notch filter to be placed between the common emitter and common base stages to reduce $2^{nd}$ harmonic generation and thereby increase $4^{th}$ harmonic output power, generation efficiency and conversion gain. To cancel $4^{th}$ harmonic components at the input that may destructively interfere with the output signal, capacitors are placed at the input of the common emitter stage, which in conjunction with the parasitic base wire inductance, form a notch filter to short the $4^{th}$ harmonic.

20 Claims, 2 Drawing Sheets

HIGH CONVERSION GAIN HIGH SUPPRESSION BALANCED CASCODE FREQUENCY QUADRUPLER

FIELD OF THE INVENTION

The present invention relates to the field of high speed circuit design, and more particularly relates to a high conversion gain, high suppression balanced cascode frequency quadrupler.

BACKGROUND OF THE INVENTION

A frequency multiplier is an electronic circuit that generates an output signal whose output frequency is a harmonic of its input frequency. Frequency multipliers generally consist of a nonlinear circuit that distorts the input signal and consequently generates harmonics of the input signal. A subsequent bandpass filter selects the desired harmonic frequency and removes the unwanted fundamental and other harmonics from the output.

Frequency multipliers are often used in frequency synthesizers and communications circuits. It can be more economic to develop a lower frequency signal with lower power and less expensive devices, and then use a frequency multiplier chain to generate an output frequency in the microwave or millimeter wave range.

The millimeter wave (mmWave) frequency range has recently become attractive for many applications, such as wireless communications, automotive based radar and imaging applications, etc. The implementation of low phase noise oscillators at such high frequencies, however, is not trivial. Some high frequency oscillator applications incorporate a frequency multiplier which is an important component in many of these systems.

SUMMARY OF THE INVENTION

There further provided in accordance with the invention, a frequency quadrupler circuit, comprising a first amplifier stage coupled to a differential input signal and operative to generate a plurality of harmonics therefrom, a second amplifier stage coupled to said first amplifier stage and operative to generate an amplified output signal from the output of said first amplifier stage, and a notch filter coupled to the input of said second amplifier stage and operative to suppress second harmonics generated by said first amplifier stage.

There is also provided in accordance with the invention, a frequency quadrupler circuit, comprising a common emitter amplifier stage coupled to a differential input signal and operative to generate a plurality of harmonics therefrom, a common base amplifier stage coupled to said common emitter amplifier stage, and a notch filter coupled to the input of said common base amplifier stage and operative to suppress a second harmonic generated by said common emitter amplifier stage.

There is further provided in accordance with the invention, a method of frequency quadrupling, said method comprising providing a common emitter amplifier stage for generating a plurality of harmonics from a differential input signal, providing a common base amplifier stage for generating an amplified output signal from said common emitter amplifier stage, and providing a notch filter operative to filter out second harmonics from the output of said common emitter amplifier stage before being input to said common base amplifier stage.

There is also provided in accordance with the invention, a frequency quadrupler circuit, comprising a common source amplifier stage coupled to a differential input signal and operative to generate a plurality of harmonics therefrom, a common gate amplifier stage coupled to said common source amplifier stage, and a notch filter coupled to the input of said common gate amplifier stage and operative to suppress a second harmonic generated by said common source amplifier stage.

BRIEF DESCRIPTION OF THE DRAWINGS

The invention is herein described, by way of example only, with reference to the accompanying drawing, wherein.

DETAILED DESCRIPTION OF THE INVENTION

In one embodiment, a local oscillator based high frequency source uses a high spectral purity voltage controlled oscillator (VCO) at lower frequency bands, the output of which is followed by a frequency multiplier. For example, the output of Ku-band or K-band VCOs need to be quadrupled in order to generate a local oscillator (LO) signal in the 60-77 GHz frequency range.

Many balanced frequency multipliers in the mmWave frequency range are frequency doublers. This implies that an additional doubling stage must be used in order to obtain a higher frequency multiplication factor. An additional stage, however, comes at the expense of increased chip area and power consumption. In addition, the combined frequency doublers will have relatively low conversion gain due to the cascading of two multiplying stages. Typically, additional amplification and filtering must be used between the doubler stages. Furthermore, each doubler stage has to be tuned for a different frequency range. Finally, the resulting overall conversion efficiency is low, thus forcing the addition of amplifying stages at the forth harmonic. Another alternative is to generate the $4^{th}$ harmonic from a saturated amplifier, filtering lower harmonics and amplifying the $4^{th}$ harmonic. This scheme, however, requires several filtering and amplifying stages, in order to achieve high $4^{th}$ harmonic conversion gain and high suppression for the other harmonics. This scheme results in an increase in chip area and power consumptions. In addition, the problem may aggravate since increasing the number of stages reduces the design robustness to temperature, supply voltage and process variation.

Figure 1:
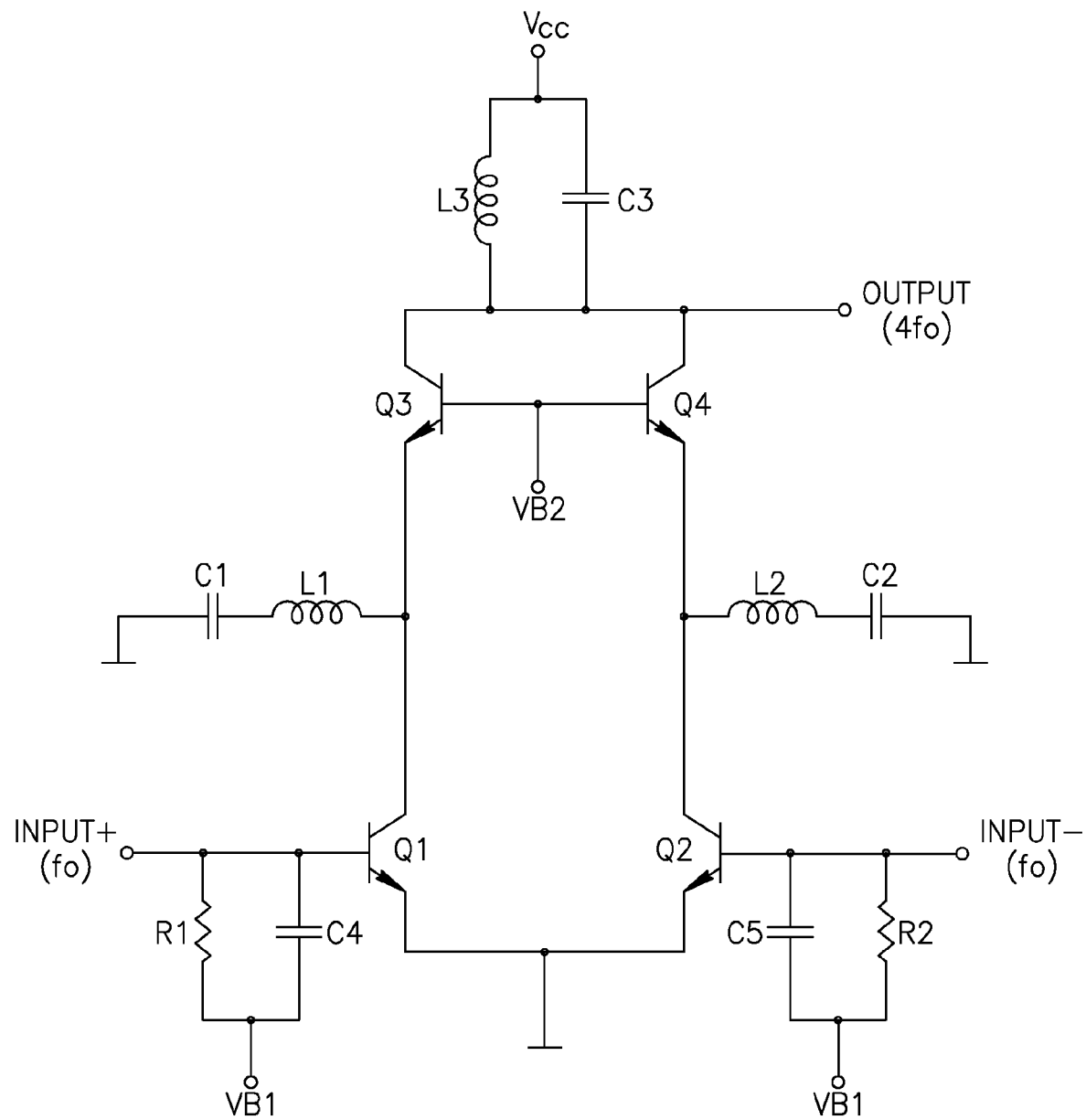
FIG. 1 is a block diagram illustrating an example balanced cascade frequency quadrupler constructed in accordance with the present invention.

A block diagram illustrating an example balanced cascade frequency quadrupler constructed in accordance with the present invention is shown in FIG. 1. The frequency quadrupler circuit, generally referenced 10, comprises transistors Q1, Q2, Q3, Q4, capacitors C1, C2, C3, C4, C5, resistors R1, R2, and inductances L1, L2, L3.

In one embodiment the frequency quadrupler uses a balanced topology to increase broadband odd harmonic suppression, while a cascode configuration is used to improve the multiplier frequency response. The cascode design also enables a notch filter to be placed between the common emitter (CE) and common base (CB) stages to reduce the $2^{nd}$ harmonics generated and thereby increase the $4^{th}$ harmonic power, generation efficiency and conversion gain.

In one embodiment, the frequency quadrupler of the present invention comprises a balanced topology which increases broadband odd harmonic suppression. In addition, in one embodiment, the frequency quadrupler is constructed in a cascode configuration. The cascode is a two-stage amplifier composed of a transconductance amplifier followed by a current buffer. In the bipolar based example embodiment provided, the cascode configuration is constructed with common emitter (CE) and common base (CB) stages which further improves the multiplier frequency response. The cascode configuration enables a notch filter to be placed between the common emitter and common base stages to reduce $2^{nd}$ harmonic generation and thereby increase $4^{th}$ harmonic power output generation, output efficiency and conversion gain. To cancel $4^{th}$ harmonic components at the input that may destructively interfere with the output signal, capacitors are placed at the input of the common emitter stage, which in conjunction with the parasitic base wire inductance, form a notch filter to short (filter out) the $4^{th}$ harmonic.

In an alternative embodiment, the same balanced cascode circuit can be implemented using MOSFET devices, where Q1 and Q2 serve as a common source (CS) stage and Q3 and Q4 serve as a common gate (CG) stage.

It is appreciated that the frequency quadrupler is not limited to the example described herein but may be constructed to have other configurations depending on the particular implementation. For example, an unbalanced cascode frequency quadrupler can be constructed where the input is a single ended signal rather than differential.

With reference to FIG. 1, the differential input signals (+input 12, −input 14) with fundamental frequency $f_0$ are fed into the base of common emitter transistors Q1 and Q2, biased by a band-gap reference circuit (VB1) for maximum $f_T$ operation point. The emitters of Q1, Q2 are tied to ground. A balanced topology is used to increase broadband odd harmonic suppression, while a cascode configuration with Q3 and Q4 common base stages is used to improve the multiplier frequency response. The base of both Q3 and A4 are tied to a band-gap reference circuit (VB2). The load, a tank circuit, is composed of capacitor C3 and inductance L3 (e.g., transmission line inductance) connected to $V_{CC}$ and tuned for the $4^{th}$ harmonic frequency range. Note that it is desired to generate maximum power at the output, and the tank circuit is tuned accordingly. For maximum output power signal generation, the tank is matched to the load at the $4^{th}$ harmonic frequency.

A notch filter is placed between the common emitter stage (Q1, Q2) and the common base stage (Q3, Q4) to filter out/suppress $2^{nd}$ harmonic generation and thereby increase the $4^{th}$ harmonic power. Each notch filter comprises a series combination of capacitor and inductance placed between the common emitter and common base stages and ground. In particular, a notch filter comprising the series combination of capacitor C1 and inductance L1 is placed between Q1, Q3 and ground. Similarly, a second notch filter comprising the series combination of capacitor C2 and inductance L2 is placed between Q2, Q4 and ground. The output 16 of the cascode configuration is the $4^{th}$ harmonic ($4f_0$) of the input signal. In one embodiment, the notch filters are tuned to ¼ wavelength ($\lambda$) (i.e. the $2^{nd}$ harmonic). Thus, the filtering out of the $2^{nd}$ harmonic from the harmonics generated by the common emitter amplifier stage (Q1, Q2) occurs before the second amplification performed by the common base stage (Q3, Q4)

To cancel any $4^{th}$ harmonic component at the input (such as generated by VCO non-linearities or through the base-collector capacitance of Q1 and Q2) that may destructively interfere with the output signal, capacitors C4 and C5 are placed in the input of the common emitter stage. Capacitors C4 and C5 in combination with the parasitic base wire inductances of Q1 and Q2 form a notch filter to short the $4^{th}$ harmonic.

Note that the ratio between the Q1, Q2 input signal (voltage $V_{in}$) to output signal (current $I_{out}$) is for example exponential in the bipolar case and is expressed as $$I_{out}=10*\exp(V_{in}/kT) \tag{1}$$

The exponent can be expanded using the well-known Taylor series to $$I_{out}=a0+a1*V_{in}+a2*V_{in}^2+a3*V_{in}^3+a4*V_{in}^4+\ldots \tag{2}$$

Typically, in analog circuits, the equation can be linearized and only the first two terms are considered, i.e. the DC 'a0' term and the linear component 'a1' term. Note that this linearization is only valid if $V_{in}$ is small enough. If $V_{in}$ is not sufficiently small, the other terms cannot be ignored and must be considered as well. Thus, if $V_{in}$ is a sine wave, the output will comprise the fundamental harmonic from the $a1*V_{in}$ term, the second harmonic from the $a2*V_{in}^2$ term, and so on.

Figure 2:
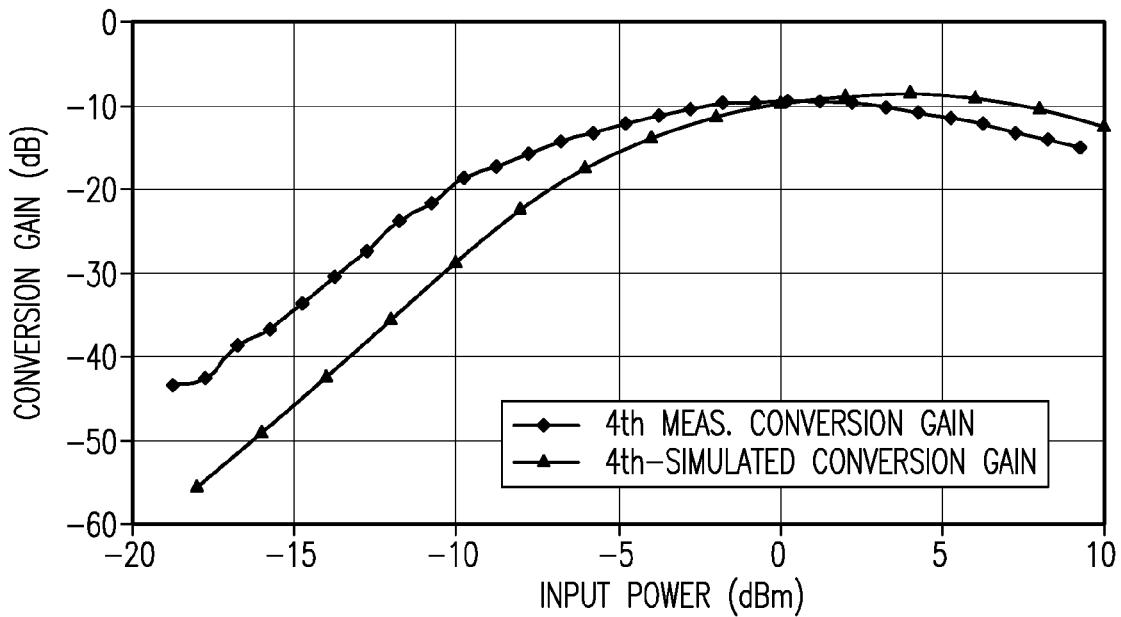
FIG. 2 is a graph illustrating $4^{th}$ harmonic conversion gain versus fundamental input power.

If sufficient $4^{th}$ harmonic signal energy is present at the input, it might superimpose with the "generated" $4^{th}$ harmonic signal (i.e. the $a4*V_{in}^4$ term). Some of the time, the signal will superimpose constructively and increase the $4^{th}$ harmonic output signal. Other times, however, it will superimpose destructively and reduce the $4^{th}$ harmonic output signal. This depends on the phase between the $4^{th}$ harmonic signal present at the input and generated by the quadrupler. Thus, to reduce the effect of destruction interference, it is preferable to filter $4^{th}$ harmonic at the input. Note that the $4^{th}$ harmonic at the input is generated from the parasitic capacitance between the collector (i.e. common emitter output) and base (i.e. common emitter input) of the Bipolar Junction Transistors (BJT) transistors Q1 and Q2. This parasitic capacitance connects the common emitter stage output to input, and therefore the "generated" 4th harm can return to the input thought this capacitor A graph illustrating $4^{th}$ harmonic conversion gain versus fundamental input power is shown in FIG. 2. The graph shows the $4^{th}$ harmonic conversion gain at the output of the quadrupler as a function of input power for an input frequency ($f_0$) of 16 GHz with an input power from −20 dBm to +10 dBm. The quadrupler shows $4^{th}$ harmonic conversion loss of approximately 8-10 dB at an input power level of 0 dBm. The $2^{nd}$ harmonic is suppressed by 20 dB Due to the configuration of the common base (collectors of Q2 and Q4 tied together), fundamental and $3^{rd}$ harmonics show extremely high suppression at the output, with conversion gains lower than −30 dB and −50 dB respectively.

In one embodiment, in order to produce a differential LO signal required by some mixer topologies, the frequency quadrupler is cascaded with a lumped balun and a differential amplifying stage both tuned to the $4^{th}$ harmonic frequency range to generate a balanced LO signal with +2 to +5 dBm power and in order to further suppress the $2^{nd}$ harmonic.

Figure 3:
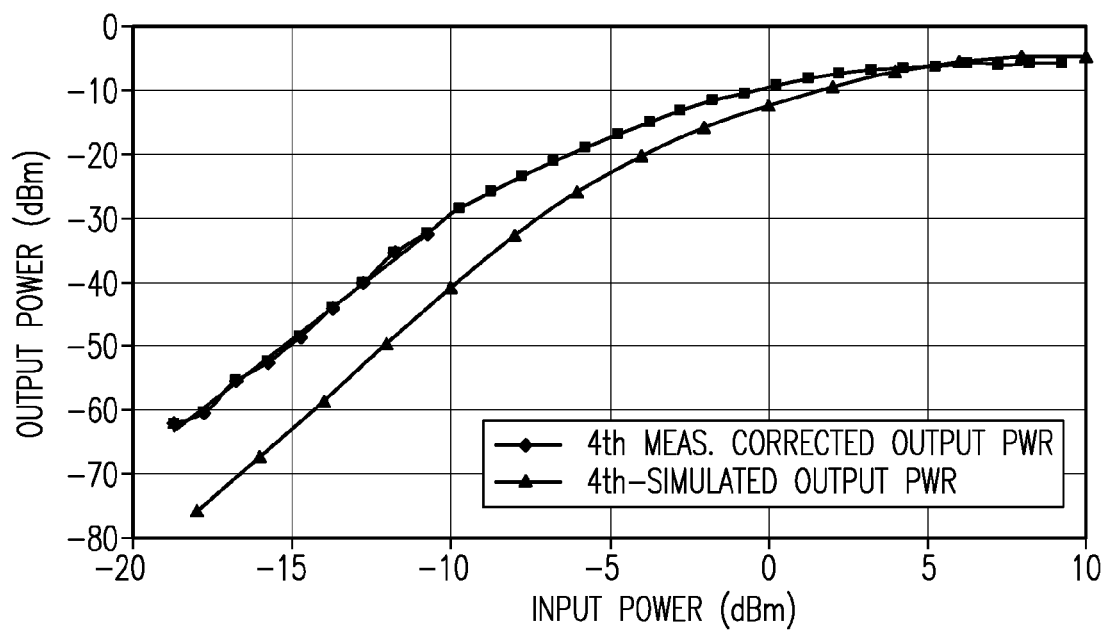
FIG. 3 is a graph illustrating $4^{th}$ harmonic output power versus fundamental input power.

A graph illustrating $4^{th}$ harmonic output power versus fundamental input power is shown in FIG. 3. The $4^{th}$ harmonic output power at the output of the frequency quadrupler is shown as a function of input power at a fundamental frequency of 16 GHz. The graph shows an output power of −6 dBm at saturation of the $4^{th}$ harmonic.

In one embodiment, the frequency quadrupler of the present invention employs a high suppression, balanced cascode topology, implemented in SiGe BiCMOS technology. Such an implementation exhibits a high conversion gain and high suppression for the 60-77 GHz frequency range with a measured value of quadrupler conversion loss of approximately 8 dB.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A frequency quadrupler circuit, comprising:
   a first amplifier stage coupled to a differential input signal and operative to generate a plurality of harmonics therefrom;
   a second amplifier stage coupled to said first amplifier stage and operative to generate an amplified output signal from the output of said first amplifier stage;
   a notch filter coupled to the input of said second amplifier stage and operative to suppress second harmonics generated by said first amplifier stage, wherein said notch filter comprises a series inductor and capacitor; and
   a capacitor coupled to said input signal and operative to cancel fourth harmonic energy.

2. The circuit according to claim 1, further comprising a load comprising a tank circuit coupled to said second amplifier stage and tuned to a fourth harmonic of said input signal.

3. The circuit according to claim 1, wherein said first amplifier stage and said second amplifier stage are configured in a balanced configuration.

4. The circuit according to claim 1, wherein said first amplifier stage and said second amplifier stage are configured in a cascade configuration.

5. The circuit according to claim 1, wherein said second amplifier stage is configured to cancel out odd harmonics of said input signal.

6. A frequency quadrupler circuit, comprising:
   a common emitter amplifier stage coupled to a differential input signal and operative to generate a plurality of harmonics therefrom;
   a common base amplifier stage coupled to said common emitter amplifier stage;
   a notch filter coupled to the input of said common base amplifier stage and operative to suppress a second harmonic generated by said common emitter amplifier stage; and
   a capacitor coupled to the base of said common emitter amplifier stage and operative to cancel fourth harmonic energy in said input signal.

7. The circuit according to claim 6, wherein said notch filter comprises a series inductor and capacitor.

8. The circuit according to claim 6, further comprising a tank circuit load coupled to the collector of said common base amplifier stage and tuned to a fourth harmonic of said input signal.

9. The circuit according to claim 6, wherein said common emitter amplifier stage and said common base amplifier stage are configured in a cascade configuration.

10. The circuit according to claim 6, wherein said common emitter amplifier stage and said common base amplifier stage are configured in a balanced configuration.

11. A method of frequency quadrupling, said method comprising:
    providing a common emitter amplifier stage for generating a plurality of harmonics from a differential input signal;
    providing a common base amplifier stage for generating an amplified output signal from said common emitter amplifier stage;
    providing a notch filter operative to filter out second harmonics from the output of said common emitter amplifier stage before being input to said common base amplifier stage; and
    filtering harmonics other than a fundamental harmonic from said input signal at the input to said common emitter amplifier stage.

12. The method according to claim 11, wherein said notch filter comprises a series inductance and capacitance placed between the input of said common base amplifier and ground.

13. The method according to claim 11, further comprising further comprising coupling a tank circuit to the collector of said common base amplifier stage, said tank circuit tuned to a fourth harmonic of said input signal.

14. The method according to claim 11, wherein said common emitter stage and said common base amplifier stage are configured in a balanced configuration.

15. The method according to claim 11, wherein said common emitter stage and said common base amplifier stage are configured in a cascade configuration.

16. The method according to claim 11, wherein said common base amplifier stage is configured to cancel out odd harmonics of said input signal.

17. A frequency quadrupler circuit, comprising:
    a common source amplifier stage coupled to a differential input signal and operative to generate a plurality of harmonics therefrom;
    a common gate amplifier stage coupled to said common source amplifier stage;
    a notch filter coupled to the input of said common gate amplifier stage and operative to suppress a second harmonic generated by said common source amplifier stage; and
    a capacitor coupled to the gate of said common source amplifier stage and operative to cancel fourth harmonic energy in said input signal.

18. The circuit according to claim 17, wherein said common source amplifier stage and said common gate amplifier stage are configured in a cascade configuration.

19. The circuit according to claim 17, wherein said common source amplifier stage and said common gate amplifier stage are configured in a balanced configuration.

20. The circuit according to claim 17, wherein said common source amplifier stage and said common gate amplifier stage are configured in a balanced configuration.

\* \* \* \* \*